(12) United States Patent
Kato et al.

(10) Patent No.: US 9,231,419 B2
(45) Date of Patent: Jan. 5, 2016

(54) SEMICONDUCTOR DEVICE AND BATTERY PACK

(71) Applicant: Renesas Electronics Corporation, Kawasaki-shi, Kanagawa (JP)

(72) Inventors: Daisuke Kato, Kanagawa (JP); Ryosuke Enomoto, Kanagawa (JP); Lin Xing, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 247 days.

(21) Appl. No.: 14/082,285

(22) Filed: Nov. 18, 2013

(65) Prior Publication Data
US 2014/0203762 A1 Jul. 24, 2014

(30) Foreign Application Priority Data

Jan. 23, 2013 (JP) ................................ 2013-010127

(51) Int. Cl.
H02J 7/00 (2006.01)
(52) U.S. Cl.
CPC ............. *H02J 7/0031* (2013.01); *H02J 7/0081* (2013.01); *H02J 7/0083* (2013.01); *H02J 7/0093* (2013.01); *H02J 2007/0037* (2013.01); *H02J 2007/0039* (2013.01); *H02J 2007/0098* (2013.01)
(58) Field of Classification Search
USPC .......... 320/107, 118, 134, 138, 128, 127, 132
See application file for complete search history.

(56) References Cited

U.S. PATENT DOCUMENTS

| 6,489,749 | B1 * | 12/2002 | Nakashimo | ........ G01R 31/3624 320/134 |
|---|---|---|---|---|
| 6,803,745 | B2 | 10/2004 | Nishida et al. | |
| 7,567,116 | B2 * | 7/2009 | Yoshio | ................ H01M 10/425 320/134 |
| 2007/0001646 | A1 * | 1/2007 | Kojima | ................. H02J 7/0011 320/128 |
| 2009/0115374 | A1 * | 5/2009 | Noda | .................... H01M 10/44 320/138 |
| 2010/0129700 | A1 * | 5/2010 | Tanno | ................. H01M 10/441 429/93 |
| 2011/0298424 | A1 * | 12/2011 | Yamauchi | ........... H01M 10/441 320/118 |
| 2011/0304299 | A1 * | 12/2011 | Yang | ....................... H02J 7/045 320/107 |
| 2014/0203762 | A1 * | 7/2014 | Kato | ..................... H02J 7/0031 320/107 |

FOREIGN PATENT DOCUMENTS

| JP | 09-285033 A | 10/1997 |
|---|---|---|
| JP | 2005-312140 A | 11/2005 |
| JP | 2006-311799 A | 11/2006 |

* cited by examiner

*Primary Examiner* — Brian Ngo
(74) *Attorney, Agent, or Firm* — Miles & Stockbridge P.C.

(57) ABSTRACT

In a battery monitoring system included in a secondary battery, high-accuracy charge control is enabled at low cost. A semiconductor device includes: a drive unit which drives a transistor for controlling the charge current of a secondary battery and which is configured to be capable of selecting one of plural different voltages as a drive voltage (VGC) for turning on the transistor; and a data processing control unit which performs program processing. The data processing control unit generates condition information including information about the battery level of the secondary battery based on measured values of the secondary battery voltage and current and adjusts the charge current of the secondary battery by changing the drive voltage selection.

10 Claims, 6 Drawing Sheets

SEMICONDUCTOR DEVICE AND BATTERY PACK

CROSS-REFERENCE TO RELATED APPLICATIONS

The disclosure of Japanese Patent Application No. 2013-010127 filed on Jan. 23, 2013 including the specification, drawings and abstract is incorporated herein by reference in its entirety.

BACKGROUND

The present invention relates to a semiconductor device and a battery pack and, more particularly, to a technique effective in controlling, in a semiconductor device for monitoring the condition of a secondary battery, charging of the secondary battery.

With portable devices, typically smartphones, rapidly spreading in recent years, demand for secondary batteries for driving such portable devices has been rapidly increasing. Since secondary batteries are required to drive portable devices for a long period of time, large-capacity secondary batteries have been developed by many enterprises and organizations. In using a secondary battery to drive a portable device for a long period of time, controlling not only the capacity but also the battery level of the secondary battery is important. To control the battery level of a secondary battery, a method dependent on detection of the output voltage of the secondary battery has been in use. Since, however, it is a characteristic of secondary batteries that their output voltages are approximately constant over their normal operating ranges, the battery level of a secondary battery cannot be accurately controlled by the method in which the output voltage of the secondary battery is detected. Hence, it has been difficult to drive a portable device for a long period of time even by using a large-capacity secondary battery. Under such circumstances, it is currently a mainstream approach to install a "battery monitoring system" on the battery pack side to detect the charge/discharge current of a secondary battery and accurately control the battery level of the secondary battery. A battery monitoring system generally includes an FG-IC (fuel gauge IC), a sense resistor, a MOS transistor for charge control, a MOS transistor for discharge control, and a protection circuit (e.g. a thermistor, secondary protection IC, or fuse) and is provided in a battery pack along with a secondary battery. For example, the FG-IC includes a microcontroller and has functions for controlling the battery level of a secondary battery, controlling MOS transistors for charge and discharge control, and providing primary protection for the secondary battery. The sense resistor is used to detect the charge current and discharge current of the secondary battery as voltage information. The sense resistor for current detection is required to be of high accuracy and a low resistance. Generally, therefore, such a sense resistor is not a resistor element which is formed in the FG-IC using a semiconductor process involving significant accuracy variation. An external high-accuracy resistor element is used as such a sense resistor. The protection circuit such as a thermistor, secondary protection IC, or fuse monitors the condition of the battery and, if any abnormal condition is detected, stops charging or discharging of the battery by turning off the MOS transistor for charge or discharge control so as to prevent the battery from entering a dangerous condition. Existing techniques concerning secondary battery protection functions are disclosed, for example, in Japanese Unexamined Patent Publication Nos. 2005-312140 and Hei 09 (1997)-285033 hereinafter referred to as Patent Document 1 and Patent Document 2, respectively).

As is known from the fact that battery monitoring systems are provided with many protection functions, secondary batteries are dangerous. For example, if a secondary battery, typically, a lithium-ion battery is charged by applying an unnecessarily large current or an excessively high voltage, it may rupture resulting in a serious accident. Therefore, charging a secondary battery in an inappropriate manner must be avoided. This is all the more so, because inappropriate charging of a secondary battery can degrade the secondary battery resulting in shortening the battery life. Hence, besides the protection functions provided in the battery monitoring system as described above, a charge control device like the one disclosed in Japanese Unexamined Patent Publication No. 2006-311799 is provided on the charger side of the secondary battery. For example, as such a charge control device, an IC for charge control compatible with constant-current, constant-voltage charging (hereinafter referred to as CCCV charging) is widely used. In a main-stream configuration of ICs for charge control, analog control is performed as in a DC/DC converter. In CCCV charging, a battery is charged, while its battery level is low using a constant current and, when the battery nears a fully charged state, the battery is charged in a manner to keep the battery voltage constant. To perform CCCV charging of a battery, a sense resistor for current detection is required so that whether the charge current is at an appropriate level can be monitored. The sense resistor, like the one provided in the above battery monitoring system, is also required to be of high accuracy and a low resistance. Therefore, a relatively expensive external resistor element is used as such a sense resistor. Also, in many cases, the charge control device is provided with, in addition to the IC for charge control and the sense resistor, an external transistor for charge control which can turn on/off charging.

SUMMARY

As described above, a system for controlling a secondary battery requires, in addition to a high-accuracy charge control device to be provided on the charger side, a battery monitoring system to be provided on the battery pack side. Such a high-accuracy charge control device and a battery monitoring system used to be provided as separate circuits, contributing to a cost increase. For example, in a system for secondary battery control, a sense resistor for charge current detection and an external transistor for charge control used to be provided in each of a charge control device and a battery monitoring system. This contributes toward increasing the system cost.

In each of Patent Documents 1 and 2, a configuration is disclosed in which a protection circuit for protecting a secondary battery from over-charging and over-discharging and a charge control circuit are provided as a unified unit in a battery pack. The charge control circuit according to Patent Document 1 performs constant-current charging by linearly controlling the gate voltage of a MOS transistor for charge control based on the measurement of the current flowing through a charge current path and performs constant-voltage charging by linearly controlling the gate voltage of the MOS transistor for charge control based on the measurement of the secondary battery voltage. The charge control circuit according to Patent Document 2 adjusts the charge current of a secondary battery by PWM-controlling a MOS transistor for charge control in accordance with a duty factor set from outside.

The configuration according to Patent Document 1 makes it possible to reduce overlapping parts such as sense resistors. However, the configuration in which a protection circuit and a charge control circuit are unified is not one designed taking into consideration a battery monitoring system which is provided with a battery level control function in addition to a protection function against over-charging and over-discharging that of an FG-IC. Hence, the technique according to Patent Document 1 cannot be applied, as it is, to a battery monitoring system. With the configuration according to Patent Document 1 being based on the assumption that the internal circuit of an existing IC for charge control will be used, applying the technique to a battery monitoring system will enlarge the circuit size, possibly inviting a cost increase. On the other hand, the configuration according Patent Document 2 provided with no sense resistor for charge current monitoring may make it possible to reduce the number of parts. However, since the configuration is not designed to perform PWM control by monitoring the charge current and determining an optimum duty factor, it is difficult to stably control the charge current with high accuracy.

In the following, means for solving the above problems will be described. Other objects and novel features of the present invention will become apparent from the description of this specification and the accompanying drawings.

A typical embodiment of the present invention disclosed in the present application is outlined below.

The semiconductor device according to the present invention includes: a drive unit which drives a transistor for controlling the charge current of a secondary battery and which is configured to be capable of selecting one of different voltages as a drive voltage for turning on the transistor; and a data processing control unit which performs program processing. The data processing control unit generates condition information including information about the battery level of the secondary battery based on measured values of the secondary battery voltage and current and adjusts the charge current of the secondary battery by changing the drive voltage selection.

The advantageous effect of the present invention disclosed in the present application is summarized below.

The semiconductor device according to the present invention enables high-accuracy charge control at low cost in a battery monitoring system for a secondary battery.

DETAILED DESCRIPTION

1. Outline of an Embodiment

First, a typical embodiment of the invention disclosed in the present application will be outlined. Note that the reference numerals used in the attached drawings and referred to, in parentheses, in the following outline description of a typical embodiment of the present invention merely denote exemplary constituent elements included in the concepts of possible constituent elements.

[1] Semiconductor Device Capable of Monitoring the Battery Level and Controlling Charging of a Secondary Battery A semiconductor device (10) according to a typical embodiment of the present invention monitors the condition of a secondary battery (11) and controls charging of the secondary battery. The semiconductor device includes a voltage measuring unit (105) for measuring the voltage of the secondary battery, a current measuring unit (107) for measuring the current of the secondary battery, a drive unit (110) which drives a transistor (13) for controlling the charge current (Ich) of the secondary battery, and a data processing control unit (102) which executes programmed processing. The data processing control unit generates, based on measurement values provided by the voltage measuring unit and the current measuring unit, condition information about the secondary battery including battery level information and controls the drive unit. The drive unit provides plural different voltages selectively usable as a drive voltage for turning on the transistor. The data processing control unit adjusts the charge current of the secondary battery by switching the drive voltage selection.

The above configuration makes it possible to control, in a battery monitoring system, the battery level of a secondary battery and charging of the secondary battery. The semiconductor device can adjust the charge current by changing the magnitude of the gate drive voltage for the transistor based on the result of measuring the charge current of the secondary battery, so that charging of the secondary battery can be controlled with high accuracy. Charge control for the secondary battery is realized by means of battery level control for the secondary battery and programmed processing performed by the data processing control unit. Therefore, compared with a case in which a separate analog circuit for charge current feedback control is required, the increase in chip area can be suppressed. Furthermore, since charging of the secondary battery can be controlled by programmed processing, charge control is compatible not only with CCCV charging but also with various other charging methods. Hence, compared with cases where an analog circuit is used, flexible charge control can be realized with ease. The semiconductor device, therefore, makes it possible to perform charge control with high accuracy on the battery monitoring system side without requiring any high-accuracy charge control device to be provided on the charger side. This facilitates reducing the overall system cost.

[2] Details of the Drive Unit

The drive unit included in the semiconductor device described in [1] above includes a voltage generation circuit (1104, 1105) for generating plural voltages and a voltage selection circuit (1101) which selects, based on an instruction from the data processing control unit, one of the voltages generated by the voltage generation circuit. The drive unit further includes a drive signal generation unit (1100, 1103) which generates a drive signal (VGC) for driving the transistor based on an instruction form the data processing control unit and a level shifting circuit (1102) which shifts the level of the drive signal generated by the drive signal generation unit into the voltage selected by the voltage selection circuit.

According to the above configuration, drive voltage switching control by the data processing control unit can be realized with ease.

[3] Dividing Reference Voltage

The semiconductor device described in [2] above further includes a regulator circuit (104) which generates a reference voltage (VREF1) based on the voltage of the secondary battery. The voltage generation circuit includes a first resistor ladder circuit (1104) for dividing the reference voltage generated by the regulator circuit into plural voltages.

According to the above configuration, it is easy to generate plural voltages out of which one can be selected as the drive voltage.

[4] Dividing Secondary Battery Voltage VCC

In the semiconductor device described in [3] above, the voltage generation circuit includes a second resistor ladder circuit (1105) for dividing the input secondary battery voltage (VCC) into plural voltages.

According to the above configuration, voltages higher than the internal supply voltage provided by the regulator circuit can be generated as voltages selectable as the drive voltage. This makes it possible to use a drive voltage selected from widely ranging voltages, so that the charge current variation range can be widened.

[5] PWM Control of Charge Current

The semiconductor device described in any one of [2] to [4] above further includes a PWM signal generation unit (116) which generates a PWM signal in accordance with the conditions set by the data processing control unit. The drive signal generation unit generates a drive signal corresponding to the pulse period and duty ratio of the PWM signal generated by the PWM signal generation unit.

According to the above configuration, in addition to drive voltage magnitude selection, charge current magnitude adjustment by means of changing the duty ratio of the PWM signal is enabled, so that charge control with increased flexibility is made possible.

[6] CCCV Charging

In the semiconductor device described in any one of [1] to [5] above, when charging the secondary battery, the data processing control unit performs processing (S102) in which the charge rate calculated based on the current value measured by the current measuring unit and a target charge rate are compared and processing (S103, S104) in which, when the calculated charge rate is higher than the target charge rate, the drive voltage is selected such that the calculated charge rate and the target charge rate are equalized. The data processing control unit further performs processing (S106, S107) in which, when, after starting of charging, the secondary battery voltage has risen to a fully charged voltage, the drive voltage selection is changed such that the voltage of the secondary battery does not exceed the fully charged voltage. Furthermore, when the current value measured by the current measuring unit becomes smaller than a charge ending current, the data processing control unit performs processing (S108) in which the drive signal generation unit is instructed to generate a drive signal for turning off the transistor.

According to the above arrangement, CCCV charging can be easily realized in the battery monitoring system.

[7] Trickle Charging

In the semiconductor device described in [5] or [6] above, when charging the secondary battery, the data processing control unit performs processing (S302 to S304) in which the drive voltage is selected such that the current value measured by the current measuring unit and a target current value for trickle charging are equalized and processing (S305) in which conditions for the PWM signal to be generated are set in the PWM signal generation unit. The data processing control unit further performs processing (S306 to S309) in which, when, after starting of charging, the voltage of the secondary battery has risen to a first threshold voltage (VTH1), the PWM signal generation unit is made to stop outputting the PWM signal and, when the voltage of the secondary battery has lowered to a second threshold voltage (VTH2) lower than the first threshold voltage, the PWM signal generation unit is made to restart outputting the PWM signal.

According to the above arrangement, trickle charging can be easily realized.

[8] Pre-Charging

In the semiconductor device described in any of [5] to [7] above, when charging the secondary battery, the data processing control unit performs processing (S201 to S206) in which, when the voltage of the secondary battery is lower than a third threshold voltage (VTH0), the drive voltage is selected such that the current value measured by the current measuring unit and a target current value for pre-charging are equalized and processing (S207) in which conditions for the PWM signal to be generated are set in the PWM signal generation unit. The data processing control unit further performs processing (S211) in which, when, after starting of charging, the voltage of the secondary battery rises, generation of the drive signal is continued until the voltage of the secondary battery reaches the third threshold voltage and processing (S210) in which, when, after starting of charging, the voltage of the secondary battery does not rise, generation of the drive signal is stopped.

According to the above arrangement, pre-charging can be easily realized in a battery monitoring system. Even though enabling pre-charging in a battery monitoring system used to require a transistor for pre-charging having a large on-resistance to be disposed in parallel with a transistor for charge control, the present semiconductor device that can adjust the on-resistance of the transistor for charge control by changing the drive voltage does not require the transistor for pre-charging.

[9] Pulse Charging

In the semiconductor device described in any of [5] to [8] above, when charging the secondary battery, the data processing control unit performs processing (S402 to S404) in which the drive voltage is selected such that the current value measured by the current measuring unit and a target current value for pulse charging are equalized and processing (S405) in which conditions for the PWM signal to be generated are set in the PWM signal generation unit and the PWM signal generation unit is instructed to output the PWM signal. The data processing control unit further performs processing (S407, S408) in which, when, after starting of charging, the secondary battery voltage has risen to a fully charged voltage, the PWM signal generation unit is made to stop outputting the PWM signal and in which the drive signal generation unit is instructed to generate a drive signal for turning on the transistor. Furthermore, the data processing control unit performs processing (S409, S410) in which the drive voltage is lowered so as not to allow the voltage of the secondary battery to exceed the fully charged voltage. Still furthermore, the data processing control unit performs processing (S411) in which, when the current value measured by the current measuring unit becomes smaller than the charge ending current, the drive signal generation unit is instructed to generate a drive signal for turning off the transistor.

According to the above arrangement, pulse charging and constant-voltage charging can be easily realized in a battery monitoring system.

[10] Battery Pack with a Battery Monitoring System Capable of Charge Control

A battery pack (1) according to a typical embodiment of the present invention includes a first power terminal (T1), a second power terminal (T2), and the secondary battery (11) that is coupled between the first power terminal and the second power terminal and that includes a single or plural cells. The battery pack further includes a first transistor (13) which is for controlling the charge current of the secondary battery and which is disposed in a current path formed through the secondary battery between the first power terminal and the second power terminal, a second transistor (14) for controlling the discharge current of the secondary battery, a sense resistor (12) disposed in the current path, and the semiconductor device (10) described in any of [1] to [9] above. The semiconductor device is enabled by the voltage measuring unit to measure the voltage across the secondary battery, is enabled by the current measuring unit to measure the current flowing through the sense resistor, and is enabled by the drive unit to drive the first and the second transistor.

According to the above arrangement, it is possible on the battery pack side to monitor the battery condition and control charging of the battery. Therefore, the battery charger to be used is required to have a simple-structured IC for charge control capable of constant current output and is not required to be provided with any high-accuracy, charge control device. Without the battery charger requiring any high-function IC for charge control, sense resistor, or transistor for charge control, the number of parts of the battery charger can be reduced to promote reducing the overall system cost.

2. Details of Embodiment

The present embodiment will be described in further detail below.

Figure 1:
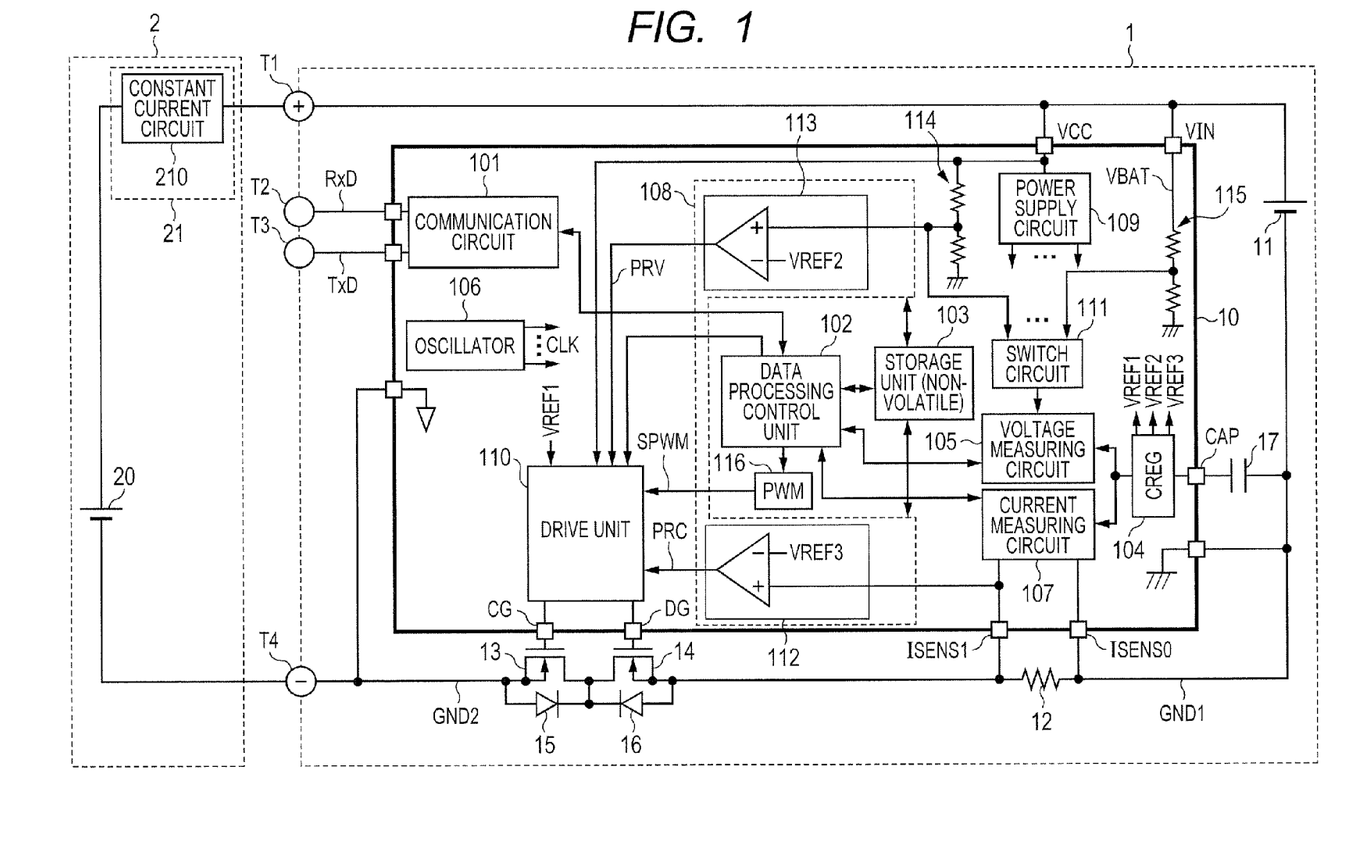
FIG. 1 shows the configuration of a battery pack having an IC for battery control according to an embodiment of the present invention.

FIG. 1 shows the configuration of a battery pack having an IC for battery control according to the present embodiment. A battery pack 1 shown in FIG. 1 is for installation in an electronic device such as a mobile terminal, for example, a smartphone, a notebook computer or a power-assisted bicycle. When installed in an electronic device, the battery pack 1 functions as a power supply required to operate the electronic circuit of the device. It can be charged as required by being coupled to a charger 2. Changes in the condition of the battery included in the battery pack 1 caused when the battery is charged or discharged are detected in real time by an IC 10 for battery control. The result of the detection is transmitted to the electronic device in which the battery pack 1 is installed. The battery pack 1 includes a battery 11, the IC 10 for battery control, a sense resistor 12, a MOS transistor 13 for charging, a MOS transistor 14 for discharging, and other parts such as a protection circuit, not shown. The battery pack 1 is sealed, for example, by an insulating resin. The battery pack 1 is provided with terminals T1, T2, T3, and T4. The terminal T1 is a positive (+) terminal and the terminal T4 is a negative (−) terminal. The terminal T2 is a data receiving terminal and the terminal T3 is a data transmitting terminal. The terminals T1 and T4 of the battery pack 1 are, for example, coupled to the charger 2 so that the battery pack 1 can be charged by the charger 2. The charger 2 includes, for example, a power supply unit 20 which generates a DC voltage based on an AC power supply and a constant-current circuit 210 which generates a constant current based on the DC voltage supplied by the power supply unit 20. The battery pack 1 is charged by having a constant current (hereinafter referred to as "input current IIN") generated by the constant current circuit 210 of the charger 2 supplied thereto. The battery pack 1 having been charged is installed in an electronic device, for example, one of those mentioned above and supplies power, via the terminals T1 and T4, to the electronic circuit of the electronic device. The terminals T2 and T3 are used for communication between the battery pack 1 and the electronic device in which the battery pack 1 is installed or the charger 2.

The battery 11 is an assembled battery including, for example, electrically series-coupled cell groups each including electrically parallel-coupled cells capable of being charged and discharged. The battery 11 may be, for example, a rechargeable lithium-ion battery or nickel-hydrogen battery or a fuel battery. The capacity of the battery 11 can be increased by increasing the number of cells parallel-coupled in each cell group. The voltage of the battery 11 can be increased by increasing the number of series-coupled cell groups. In cases where the power consumption of the electronic device in which the battery pack 1 is installed is small, the battery pack 11 may be composed of a single cell.

The IC 10 for battery control, sense resistor 12, MOS transistor 13 for charging, and MOS transistor 14 for discharging make up a battery monitoring system.

The IC 10 for battery control is a semiconductor device having a function for monitoring the condition of the battery 11 and outputting information about the detected battery condition such as a battery level, a protection function for protecting the battery 11 from stresses such as overcurrent and overvoltage, and a function for controlling charging and discharging of the battery 11. Namely, the IC 10 for battery control is provided with the protection function and charge control function in addition to the known functions of an FG-IC. The IC 10 for battery control is formed, though not limited to, on a semiconductor substrate such as a single-crystal silicon substrate using known technology for semiconductor integrated circuit fabrication. The IC 10 for battery control is, for example, a microcontroller. An external terminal CG of the IC 10 for battery control is coupled to the gate terminal of the MOS transistor 13 for charging. An external terminal DG of the IC 10 for battery control is coupled to the external terminal of the MOS transistor 14 for discharging. External terminals ISENS1 and ISENS0 of the IC 10 for battery control are coupled to the sense resistor 12. The MOS transistor 13 for charging and the MOS transistor 14 for discharging may be, though not limited to, n-channel MOS transistors. The sense resistor 12 is a resistive element for detecting a discharge current of the battery 11. It is a high-accuracy external resistor. The MOS transistor 13 for charging, MOS transistor 14 for discharging, and sense resistor 12 are coupled in series to a current path extending from the terminal T1 to the terminal T4 via the battery 11. Turning on/off of the MOS transistors 13 and 14 is controlled by the IC 10 for battery control as being described in detail later. Referring to FIG. 1, the node coupling the negative pole of the battery 11 and the sense resistor 12 and the potential of the node are denoted as a first ground "GND1" and the node coupling the MOS transistor 13 for charging and the terminal T4 and the potential of the node are denoted as a second ground "GND2".

The IC 10 for battery control includes, though not limited to, a communication circuit 101, a data processing control unit 102, a storage unit 103, a high-accuracy power supply (CREG) 104, a voltage measuring circuit 105, an oscillator 106, a current measuring circuit 107, a protection function circuit 108, a power supply circuit 109, a drive unit 110, a switch circuit 111, and a PWM signal generation unit (PWM) 116.

The switch circuit 111 selectively supplies one of plural analog signals (voltages) to the voltage measuring circuit 105. The analog signals include, for example, an output signal of a temperature detection thermistor (not shown) disposed near the battery 11 in addition to voltages generated, using a voltage dividing resistor 115, by dividing the voltage VBAT on the positive side of the battery 11 obtained via the terminal VIN and voltages generated, using a voltage dividing resistor 114, by dividing the voltage obtained via the terminal VCC. The reference code "VCC" represents not only the terminal but also the voltage at the terminal. The voltage measuring circuit 105 measures the voltage selected by the switch circuit 111, converts the voltage into a digital signal and sends it to the data processing control unit 102. For example, the voltage measuring circuit 105 measures the voltage VBAT on the positive side of the battery 11 using the first ground GND1 as a reference. The result of voltage measurement is sent to the data processing control unit 102 after being converted into a digital signal.

The current measuring circuit 107 measures the charge and discharge currents of the battery 11 by monitoring, via the terminals ISENS0 and ISENS1, the voltage across the sense resistor 12. For example, when the battery 11 starts supplying power to an electronic device or starts being charged, the current measuring unit 107 subjects, at a predetermined period, the voltage across the sense resistor 12 to A/D conversion and generates information about the measurement of charge or discharge current. The measurement information thus generated is sent to the data processing control unit 102.

The oscillator 106 generates various clock signals for the digital circuit of the IC 10 for battery control. The clock signals generated are supplied to various parts of the IC 10 for battery control. The clock signals include, for example, a clock signal CLK for operation of the data processing control unit 102 and a reference clock signal supplied to the PWM signal generation unit 116.

The PWM signal generation unit (PWM) generates a PWM signal SPWM based on the reference clock signal supplied from the oscillator 106. For example, the PWM signal generation unit 116 includes a control register for controlling outputting and stopping of the PWM signal and a condition setting register for setting conditions for the PWM signal to be generated. The PWM signal generation unit 116 generates a desired PWM signal SPWM in accordance with settings, made by the data processing control unit 102, in the control register and the condition setting register. The conditions for the PWM signal to be generated include, for example, a target PWM signal frequency and a target PWM signal duty ratio.

The high-accuracy power supply 104 generates constant voltages of various levels based on the voltage inputted from outside to the IC 10 for battery control. The high-accuracy power supply 104 is, for example, a regulator circuit which generates voltages based on the bandgap voltage of silicon. The high-accuracy power supply 104 is coupled with an external stabilizing capacitor 17 via a terminal CAP. The voltages generated by the high-accuracy power supply 104 are supplied to various parts as voltages with relatively high stability, for example, a voltage supplied to a voltage dividing resistor or a reference voltage for a comparator (comparison circuit). To be concrete, the high-accuracy power supply 104 generates a reference voltage VREF1 (1.7 V, for example) for generating a drive voltage for the MOS transistor 13 for charging being described later in addition to a reference voltage VREF2 for an overvoltage detection circuit 113, a reference voltage VREF3 for an overcurrent detection circuit 112, and reference voltages for the voltage measuring circuit 105 and the current measuring circuit 107.

The power supply circuit 109 obtains the voltage supplied from the battery 11 via the external terminal VCC and generates, by stepping down the voltage, operation voltages for the principal circuits of the IC 10 for battery control.

The protection function circuit 108 is a function unit for protecting the battery 11 from stresses such as overvoltage and overcurrent. The protection function circuit 108 includes, for example, the overcurrent detection circuit 112 and the overvoltage detection circuit 113. The overcurrent detection circuit 112 obtains the terminal voltage of the sense resistor 12 via the terminals ISENS0 and ISENS1 and, based on the voltage obtained, detects an overcurrent state of the battery 11. The overvoltage detection circuit 113 divides, using the voltage dividing resistor 114, the voltage inputted via the terminal VCC and, based on the divided voltage, detects an overvoltage state of the battery 11. A result PRC of overcurrent detection by the overcurrent detection circuit 112 and a result PRV of overvoltage detection by the overvoltage detection circuit 113 are sent to the drive unit 110.

The drive unit 110 controls turning on/off of the MOS transistor 13 for charging and MOS transistor 14 for discharging based on the control signals from the data processing control unit 102, results of overcurrent and overvoltage detection by the overcurrent detection circuit 112 and overvoltage detection circuit 113, and the PWM signal SPWM from the PWM signal generation unit 116. Details of the drive unit 110 will be described later.

The MOS transistor 13 for charging is turned on to charge the battery 11 and is turned off to stop charging of the battery 11. For trickle charging and pulse charging being described later, turning on/off of the MOS transistor 13 for charging is controlled at predetermined pulse period and a duty ratio. When the MOS transistor 13 for charging is off, the battery 11 cannot be charged but it can discharge via a parasitic diode 15 coupled in parallel to the MOS transistor 13 for charging.

The MOS transistor 14 for discharging is turned on to discharge the battery 11 and is turned off to stop discharging of the battery 11. When the MOS transistor 14 for discharging is off, the battery 11 cannot be discharged but it can be charged via a parasitic diode 16 coupled in parallel to the MOS transistor 14 for discharging.

The communication circuit 101 transmits, based on instructions from the data processing control unit 102, data TxD to outside via the terminal T3 of the IC 10 for battery control. The communication circuit 101 also receives data RxD from outside via the terminal T2 of the IC 10 for battery control and transmits the received data to the data processing control unit 102. For example, information about the condition of the battery 11 generated by the data processing control unit 102 including, for example, battery level information is transmitted to the above-mentioned electronic circuit via the terminal T3, whereas various control data about charging/discharging of the battery 11 is transmitted from the electronic circuit to the IC 10 for battery control via the terminal T2. As long as the communication circuit 101 enables data transmission and reception, the configuration thereof and the communication method used thereby are not limited to particular ones. For example, the communication circuit 101 may perform either wireless communication or wired communication. Even though, in FIG. 1, for convenience sake, one each terminal for transmission and reception is shown, there may be more terminals for transmission and for reception. Namely, the number of communication terminals is not defined.

The storage unit 103 is a non-volatile storage unit for storing data. It is composed of, for example, a flash memory. Various information is pre-stored in the storage unit 103. Such information includes, for example, information used to control charging of the battery 11, being described later (e.g. battery level information, target charge rate information, and trickle charge current information) in addition to information about characteristics of the battery 11, the number of parallel-coupled cells per cell group, the number of series-coupled cell groups, and information about differences between individual cells. Also, a program for making the data processing control unit 102 carry out various arithmetic operations and trimming information for the IC 10 for battery control is pre-stored in the storage unit 103. Furthermore, the results of arithmetic operations performed by the data processing control unit 102 can be stored in the storage unit 103. The IC 10 for battery control may include more than one storage unit 103. Namely, the above information may be divided for storage in plural storage units 103 or may be stored together in a single storage unit 103. The storage unit configuration and method of storage are not particularly defined.

The data processing control unit 102 is a program processing device which executes various operations in accordance with the program stored in the storage unit 103. The data processing control unit 102 includes, for example, a CPU and a RAM. Based on the program stored in the storage unit 103 and the results of measurement made by the voltage measuring circuit 105 and current measuring circuit 107, the data processing control unit 102 performs predetermined arithmetic processing for detecting the battery condition and generates information about the condition of the battery 11. The information about the battery condition includes, for example, FCC (full charge capacity) information indicating the battery capacity available from the battery 11 in a fully charged state by allowing the battery to be discharged at a predetermined discharge rate to a discharge ending voltage, RC (remaining capacity) information indicating the remaining capacity of the battery 11, and SOC (state of charge) information indicating the state of charging of the battery 11. The data processing control unit 102 transmits the information about the battery condition generated by the above processing to outside via the communication circuit 101 and stores the information in the storage unit 103 as required.

Furthermore, the data processing control unit 102 controls charging of the battery 11 by controlling the drive unit 110 based on the program stored in the storage unit 103 and the results of measurement made by the voltage measuring circuit 105 and current measuring circuit 107. To be concrete, the data processing control unit 102 adjusts the charge current of the battery 11 by controlling the MOS transistor 13 for charging via the drive unit 10 in accordance with the program stored in the storage unit 103 and, thereby, realizes charge control compatible with, for example, CCCV charging, trickle charging, pre-charging, and pulse charging. How the drive unit 110 is controlled for charging of the battery 11 and the internal configuration of the drive unit 110 will be described in detail below.

Figure 2:
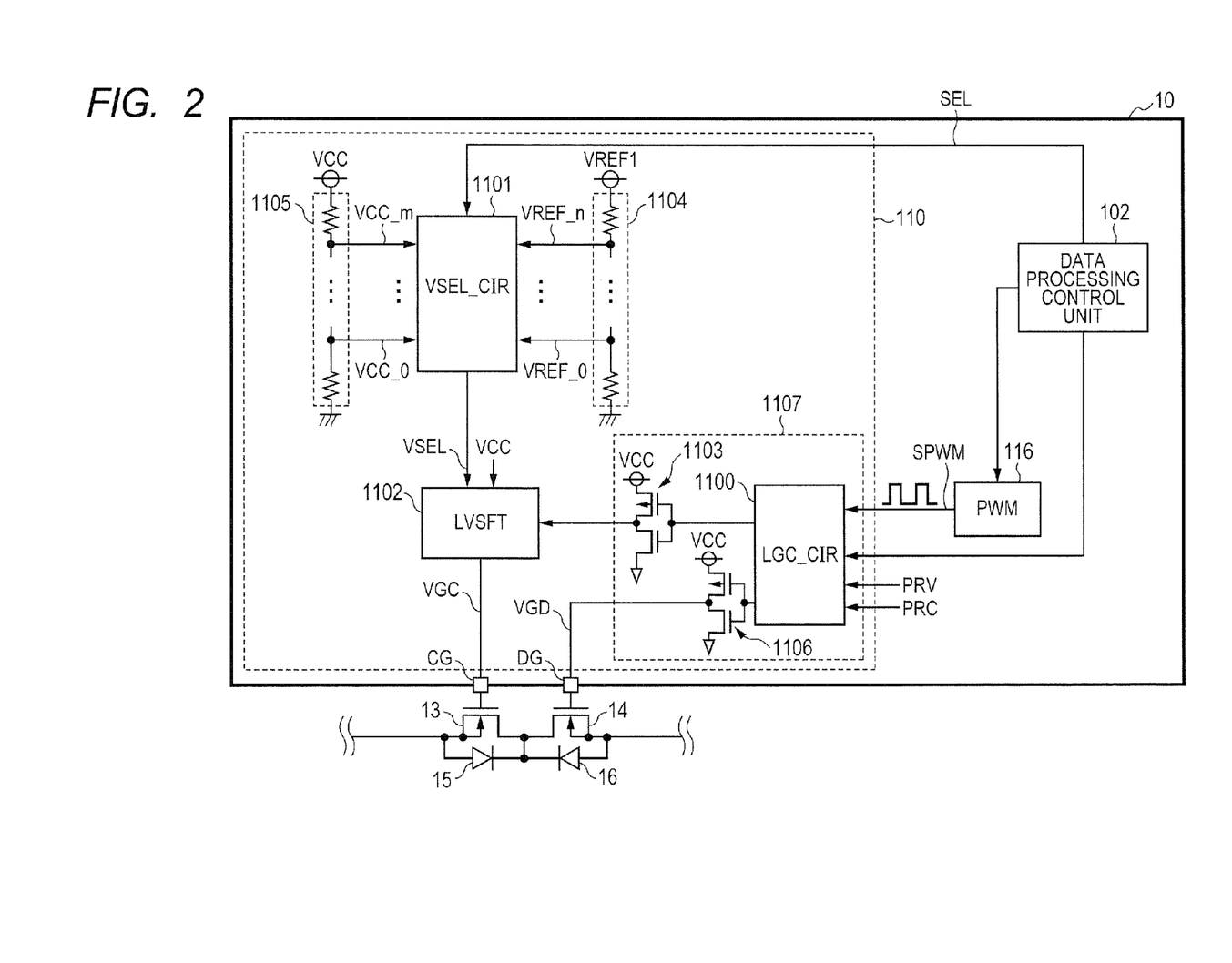
FIG. 2 shows the internal configuration of a drive unit 110.

FIG. 2 shows the internal configuration of the drive unit 110. For the convenience of description, out of the functional units of the battery pack 1, only those related with controlling of the drive unit 110 are shown in FIG. 2.

As shown in FIG. 2, the drive unit 110 includes a drive signal generation unit 1107, a level shift circuit (LVSFT) 1102, a voltage selection circuit (VSEL_CIR) 1101, and resistor ladder circuits 1104 and 1105 as voltage generation circuits.

The drive signal generation unit 1107 includes, for example, a logic circuit (LGC_CIR) 1100 and pre-driver circuits 1103 and 1106. The logic circuit 1100 generates control signals for instructing turning on/off of the MOS transistor 13 for charging and MOS transistor 14 for discharging, respectively, based on the control signals from the data processing control unit 102, the detection result PRC from the overcurrent detection circuit 112, the detection result PRV from the overvoltage detection circuit 113, and the PWM signal SPWM. These control signals are digital signals (e.g. high-level voltage VCC and low-level voltage GND2).

The pre-driver circuit 1106 generates a drive signal VGD for driving the MOS transistor 14 for discharging based on a control signal for instructing turning on/off of the MOS transistor 14 for discharging outputted from the logic circuit 1100. The drive signal VGD is outputted from the terminal DG and is supplied to the gate terminal of the MOS transistor 14 for discharging.

The pre-driver circuit 1103 generates a drive signal VGC for driving the MOS transistor 13 for charging based on a control signal for turning on/off the MOS transistor 13 for charging outputted from the logic circuit 1100. The drive signal VGC is supplied to the level shift circuit 1102.

The resistor ladder circuit 1104 generates plural voltages $VREF\_0$ to $VREF\_n$ (n being an integer of 1 or larger) by resistor-dividing the reference voltage FREF1. When the reference voltage VREF1 is 1.7 V, plural voltages $VREF\_0$ to $VREF\_n$ not exceeding 1.7 V can be generated.

The resistor ladder circuit 1105 generates plural voltages $VCC\_0$ to $VCC\_m$ (m being an integer of 1 or larger) by resistor-dividing the voltage VCC. When the maximum value of the voltage VCC is, for example, 2.7 V, plural voltages $VCC\_0$ to $VCC\_m$ not exceeding 2.7 V can be generated.

The voltage selection circuit 1101 receives voltages $VREF\_0$ to $VREF\_n$ and $VCC\_0$ to $VCC\_m$ and outputs one of the voltages selected based on a selection signal SEL from the data processing control unit 102. The voltage selection circuit 1101 includes, though not limited to, plural switch circuits which are turned on/off under control by the selection signal SEL. The voltage VSEL selected by the voltage selection circuit 1101 is supplied to the level shift circuit 1102.

The level shift circuit 1102 level-shifts the drive signal VGC supplied from the pre-driver circuit 1103 to the output voltage VSEL of the voltage selection circuit 1101. For example, the drive signal VGC with a high level VCC and a low level GND2 is level-shifted into a signal with a high level VSEL and a low level GND2. The level-shifted drive signal VGC is outputted from the terminal CG and is supplied to the gate terminal of the MOS transistor 13 for charging.

When discharging the battery 11, in accordance with control signals from the data processing control unit 102, the logic circuit 1100 outputs a control signal for turning off the MOS transistor 13 for charging and also outputs a control signal for turning on the MOS transistor 14 for discharging. At this time, the drive signal VGD for the MOS transistor 14 for discharging is set to a high level (voltage VCC) and the drive signal VGC for the MOS transistor 13 for charging is set to a low level (GND2). When, during discharging, a short-circuit current is detected by the overcurrent detection circuit 112, the logic circuit 1100 outputs a control signal for turning off the MOS transistor 14 for discharging. This sets the drive signal VGD to the low level (GND2) causing the discharge current to be shut off.

When charging the battery 11, basically, in accordance with control signals from the data processing control unit 102, the logic circuit 1100 outputs a control signal for turning on the MOS transistor 13 for charging and also outputs a control signal for turning off the MOS transistor 14 for discharging. When, during charging, an overvoltage state or an overcurrent state is detected by the overcurrent detection circuit 112 or the overvoltage detection circuit 113, the logic circuit 1100 outputs a control signal for turning off the MOS transistor 13 for charging. This sets the drive signal VGC to low level (GND2) causing charging of the battery 11 to be discontinued.

For charging of the battery 11, the charge current is adjusted by a combination of signal level switching control for the drive signal VGD supplied to the MOS transistor 13 for charging and PWM control for the MOS transistor 13 for charging.

In signal level switching control for the drive signal VGD, switching made by the data processing control unit 102 of the selection signal SEL changes the output voltage VSEL of the voltage selection circuit 1101, causing the magnitude of the drive signal VGD used to turn on the MOS transistor 13 for charging to be changed. This causes the on-resistance of the MOS transistor 13 for charging to be adjusted, so that the charge current of the battery 11 can be adjusted. The voltage selection circuit 1101 can select a voltage out of the voltages $VREF\_0$ to $VREF\_n$ generated by resistor-dividing the reference voltage VREF1 plus the voltages $VCC\_0$ to $VCC\_m$ generated by resistor-dividing the voltage VCC, so that the range of the gate drive voltage that can be supplied to the gate of the MOS transistor 13 for charging can be widened. For example, when a gate drive voltage for the MOS transistor 13 for charging is to be generated based on the reference voltage VREF (e.g. 1.7 V) supplied from the high-accuracy power supply 14, the gate drive voltage cannot exceed the reference voltage VREF1. Generating the gate drive voltage based on the voltage VCC (e.g. 2.7 V to 4.2 V), however, allows the gate drive voltage to exceed the reference voltage REF1 (1.7 V). Thus, the charge current adjustment range can be widened.

In PWM control for the MOS transistor 13 for charging, first, the data processing control unit 102 sets desired conditions (pulse period and duty ratio) for the PWM signal to be generated in the PWM signal generation unit 116. In accordance with the conditions thus set, the PWM signal generation unit 116 generates a PWM signal SPMW. The PWM signal SPMW is inputted to the logic circuit 1100. The logic circuit 1100 generates a control signal which alternates between a high level and a low level in accordance with the pulse period and duty ratio of the PWM signal. In accordance with the control signal, the pre-driver circuit 1103 generates the drive signal VGC (pulse signal). The level shift circuit 1102 shifts the high level voltage of the drive signal VGC from "VCC" to "VSEL". The drive signal VGC is then supplied to the gate terminal of the MOS transistor 13 for charging. In this way, the MOS transistor 13 for charging is PWM-controlled causing the charge current of the battery 11 to be an intermittent current. The average value of the PWM-controlled charge current can be changed by adjusting the pulse period and duty ratio of the PWM signal SPWM.

Charge control performed by the IC 10 for battery control will be concretely described below in terms of CCCV charging, pre-charging, trickle charging, and pulse charging.

First, an example case of CCCV charging will be described. In CCCV charging, as described in the foregoing, a battery is charged by a constant current while the battery level is low and, when the battery nears a fully charged state, charging is adjusted so as to make the battery voltage constant.

Figure 3:
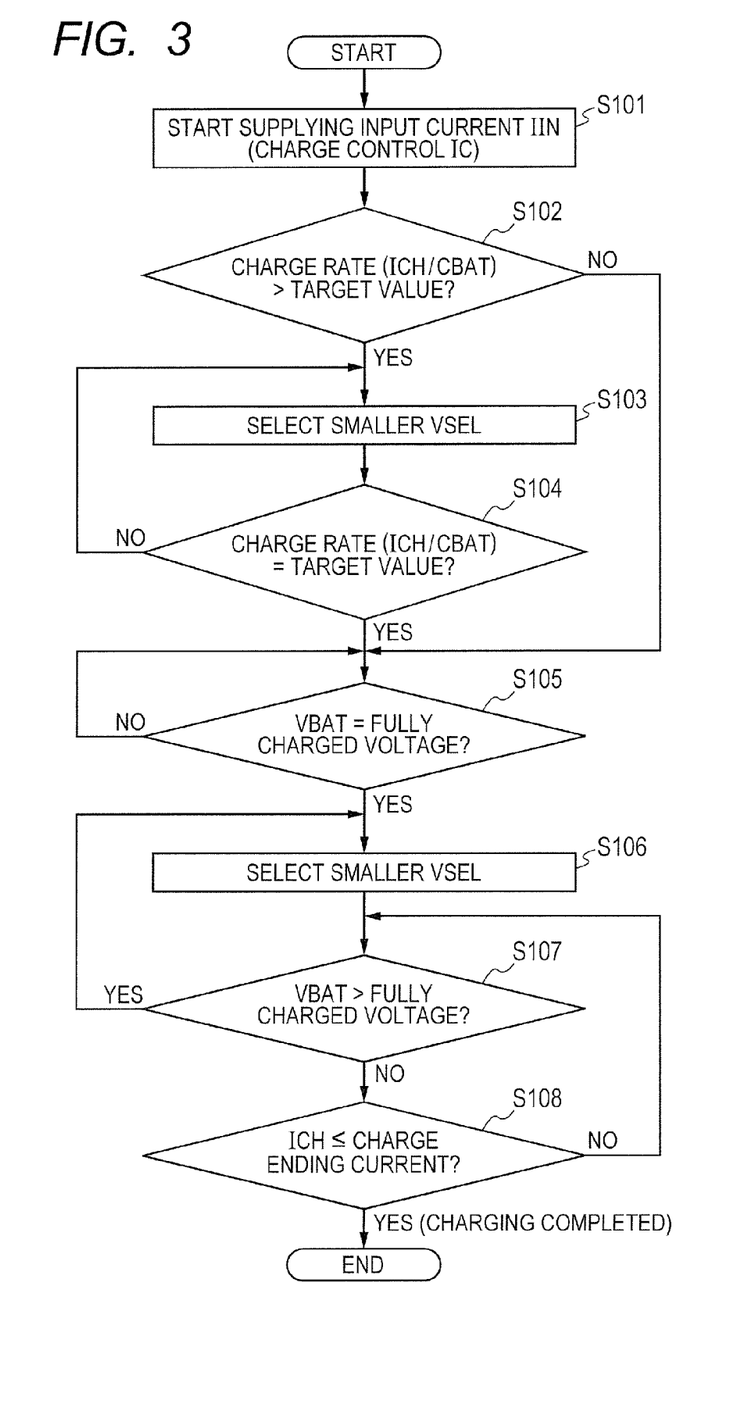
FIG. 3 is a processing flowchart of CCCV charging.

FIG. 3 is a processing flowchart of CCCV charging. In the present example, the initial value of the output voltage VSEL of the voltage selection circuit 1101 is assumed to be other than a minimum voltage (e.g. $VREF\_0$).

First, when an input current IIN for charging the battery 11 is inputted from the charger 2, the data processing control unit 102 starts charging the battery 11 by turning on the transistor 13 for charging (S101). To be concrete, the data processing unit 102 instructs the voltage selection circuit 1101 to output the initially set voltage VSEL and the logic circuit 1100 to turn on the MOS transistor 13 for charging. Namely, the data processing unit 102 instructs outputting of a high-level (VCC) drive signal VGC. As a result, a gate drive voltage (DC voltage) equal to the voltage VSEL selected by the voltage selection circuit 1101 is supplied to the gate terminal of the MOS transistor 13 for charging. Next, the data processing control unit 102 calculates the charge rate based on the charge current Ich measured by the current measuring circuit 107 and determines whether or not the charge rate is higher than a target value (S102). The charge rate is an index represented by Ich/Cbat, where Ich is a charge current (A) and Cbat is a battery capacity (Ah), and is usually represented in units of C, for example, 1C and 0.5C. For example, a charge rate of 1C represents the amount of current that can charge/discharge the whole capacity of the battery in an hour. Information about a target charge rate for CCCV charging is pre-stored, for example, in the storage unit 103 to be read by the data processing control unit 102 when making the above determination.

The processing in step S102 will be concretely described below. The data processing control unit 102 calculates the charge rate by calculating ICH/Cbat based on the value of the charge current Ich measured by the current measuring circuit 107 and the value of the battery capacity Cbat of the battery 11 read from the storage unit 103. The data processing control unit 102 then determines whether or not the calculated charge rate is larger than the target charge rate for CCCV charging read from, for example, the storage unit 103. When the calculated charge rate is higher than the target charge rate, the data processing control unit 102 changes the selection signal SEL so as to reduce the output voltage VSEL of the voltage selection circuit 1101 (S103). The data processing control unit 102 then calculates the charge rate again based on the value of the charge current Ich measured by the current measuring circuit 107 and determines whether or not the calculated charge rate equals the target charge rate (S104). When it is determined that the calculated charge rate does not equal the target value, the data processing control unit 102 again changes the selection signal SEL so as to have the next lower voltage VSEL outputted from the voltage selection circuit 1101 for comparison with the target value. This process is repeated (so as to obtain a calculated charge rate closer to the target value) until the last calculated charge rate equals the target value (S103 and S104). When it is determined that the last calculated charge rate equals the target value, charging of the battery 11 is continued at the charge rate until the value of the voltage VBAT measured by the voltage measuring circuit 105 reaches a fully charged voltage (S105). In this way, constant-current charging of the battery 11 is carried out.

Subsequently, when the voltage VBAT of the battery 11 reaches a fully charged voltage, control for switching from constant-current charging to constant-voltage charging is started. To be concrete, the data processing control unit 102 reduces the charge current Ich by switching the selection signal SEL so as to reduce the output voltage VSEL of the voltage selection circuit 1101 (S106). The data processing control unit 102 then determines whether or not the voltage VBAT of the battery 11 is higher than the fully charged voltage (S107). The fully charged voltage is an upper-limit voltage to which the battery can be charged. Information about the fully charged voltage is pre-stored, for example, in the storage unit 103 to be read by the data processing unit 102 when making the above determination. When the voltage VBAT is higher than the fully charged voltage, the data processing control unit 102 again switches the selection signal SEL so as to gradually reduce the voltage VBAT. This process is repeated until the voltage VBAT equals or is lower than the fully charged voltage (S106 and S107).

When the voltage VBAT equals or becomes lower than the fully charged voltage, the data processing control unit 102 determines whether or not the value of the charge current Ich measured by the current measuring circuit 107 is larger than a charge ending current (S108). The charge ending current represents a charge current value to be a reference for determining whether charging has been completed. Information about the charge ending current is pre-stored, for example, in the storage unit 103 to be read by the data processing control unit 102 when making the above determination. When the charge current Ich is larger than the charge ending current, processing returns to step S107 to continue constant-voltage charging. Subsequently, when the value of the charge current Ich equals or becomes smaller than the charge ending current, the data processing control unit 102 determines that charging of the battery has been completed and turns off the MOS transistor 13 for charging so as to end the charging.

Next, pre-charging will be described. In pre-charging, a battery is charged at a charge rate lower than a normal charge rate (the charge rate for CCCV charging). Generally, a battery is pre-charged when its voltage has lowered to a level much lower than its normal voltage, for example, after being left unused for an extended period of time. Such a battery is pre-charged at a low charge rate for safety as a means of determining whether or not the battery is rechargeable.

Figure 4:
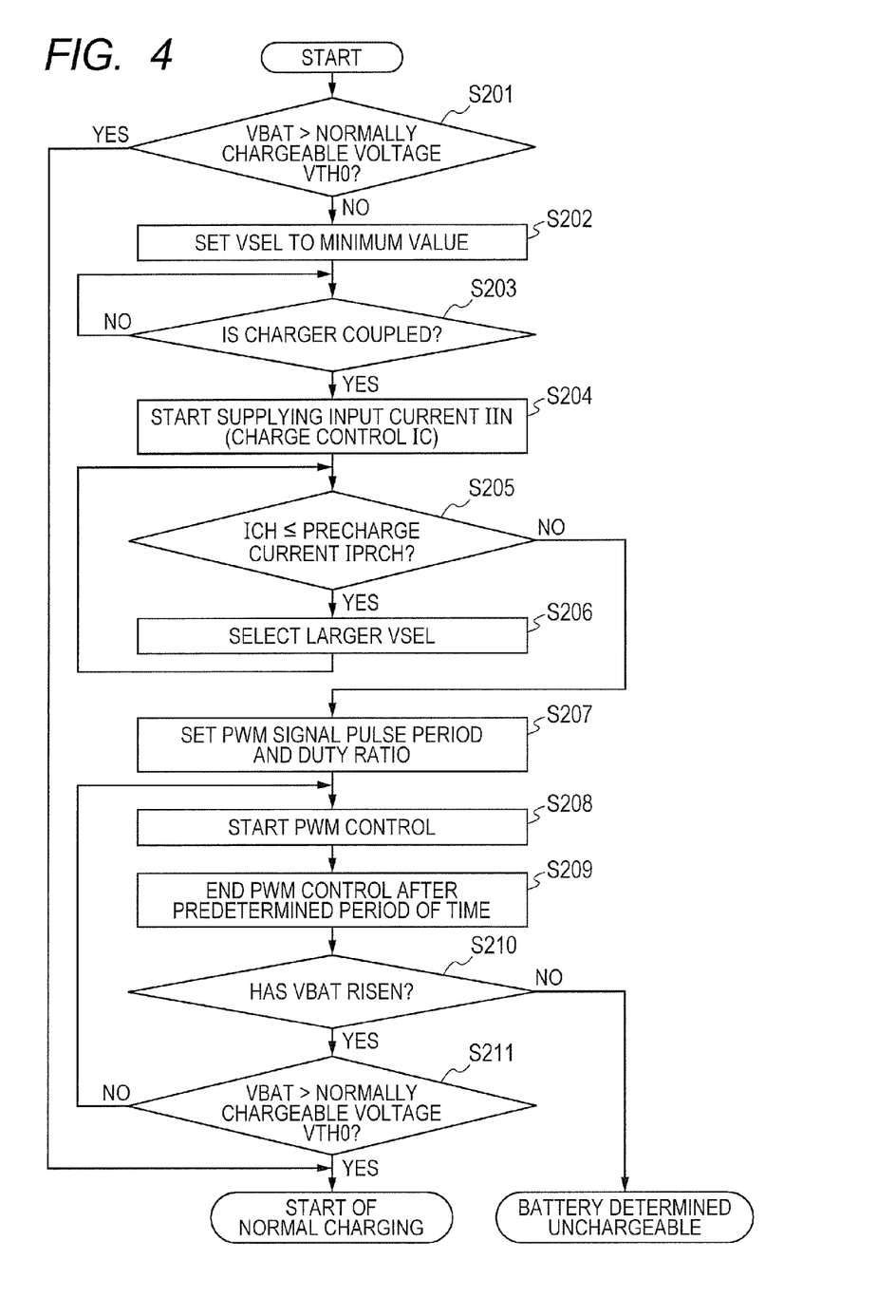
FIG. 4 is a processing flowchart of pre-charging.

FIG. 4 is a processing flowchart of pre-charging. First, the data processing control unit 102 determines whether or not the voltage VBAT of the battery 11 measured by the voltage measuring circuit 105 is equal to or higher than the normally chargeable voltage VTH0 (S201). The normally chargeable voltage VTH0 represents a battery voltage used as a reference for determining whether or not the battery can be charged in a normal manner (e.g. by CCCV charging or by pulse charging). Information about the normally chargeable voltage VTH0 is pre-stored, for example, in the storage unit 103 to be read by the data processing control unit 102 when making the above determination.

When the voltage VBAT is equal to or higher than the normally chargeable voltage VTH0, processing advances to a step for starting normal charging (e.g. CCCV charging or pulse charging). When, the voltage VBAT is smaller than the normally chargeable voltage VTH0, the data processing control unit 102 sets the voltage VSEL outputted by the voltage selection circuit 106 to a minimum voltage (S202). The data processing control unit 102 next determines whether or not the charger 2 is coupled to the battery 11 (S203). With the charger 2 coupled to the battery 11, when the input current IIN for charging the battery 11 is inputted from the charger 2, the data processing control unit 102 turns on the transistor 13 for charging to start charging the battery 11 (S204). To be concrete, the data processing control unit 102 instructs the voltage selection circuit 1101 to output the voltage VSEL at a minimum level and the logic circuit 1100 to generate the drive signal VGC of a high level (VCC). As a result, a gate drive voltage equal to the voltage VSEL (minimum voltage) selected by the voltage selection circuit 1101 is supplied to the gate terminal of the MOS transistor 13 for charging.

Next, the data processing control unit 102 determines whether or not the charge current Ich measured by the current measuring circuit 107 is smaller than a pre-charge current IPRCH (S205). The pre-charge current IPRCH represents a target charge current value for pre-charging (a maximum charge current value). Information about the pre-charge current IPRCH is pre-stored, for example, in the storage unit 103 to be read by the data processing control unit 102 when making the above determination.

When the charge current Ich is smaller than the pre-charge current IPRCH, the data processing control unit 102 switches the selection signal SEL to increase the output voltage VSEL of the voltage selection circuit 1101 (S206). As a result, the charge current Ich increases. Subsequently, the data processing control unit 102 repeats increasing the output voltage VSEL of the voltage selection circuit 1101 until the charge current Ich measured by the current measuring circuit 107 equals or exceeds the pre-charge current IPRCH (S205, S206). When the measured charge current Ich equals or exceeds the pre-charge current IPRCH, the data processing control unit 102 sets conditions for the PWM signal to be generated in the PWM signal generation unit 116 and instructs the PWM signal generation unit 116 to output the PWM signal SPWN (S207). Information about the conditions (e.g. pulse period and duty ratio) for the PWM signal to be generated at the time of pre-charging is pre-stored, for example, in the storage unit 103. The data processing control unit 102 reads the pre-stored information from the storage unit 103 and sets the information in the PWM signal generation unit 116. As a result, the charge current starts being PWM-controlled (S208). To be concrete, the logic circuit 1100 included in the drive unit 110 generates the drive signal VGC in accordance with the pulse period and duty ratio of the PWM signal SPWM and, thereby, periodically turns on/off the MOS transistor 13 for charging, causing the charge current to be intermittently controlled.

After a predetermined period of time, the data processing control unit 102 stops PWM-controlling the charge current (S209). To be concrete, the data processing control unit 102 instructs the PWM signal generation unit 116 to stop outputting the PWM signal SPWM and the logic circuit 1100 to output the drive signal VGC of a low level (GND2). Next, the data processing control unit 102 determines whether or not the voltage VBAT of the battery 11 measured by the voltage measuring circuit 107 has risen since the charging was started (S210). When it is determined that the voltage VBAT has not risen, the data processing control unit 102 determines that the battery 11 cannot be charged and stops charging the battery 11. When the voltage VBAT is determined to have risen, the data processing control unit 102 determines whether or not the voltage VBAT is equal to or higher than the normally chargeable voltage VTH0 (S211). When the voltage VBAT is lower than the normally chargeable voltage VTH0, processing returns to step S208 to restart PWM-control of the charge current. Charging of the battery 11 is continued until the voltage VBAT becomes equal to or higher than the normally chargeable voltage VTH0. When the voltage VBAT becomes equal to or higher than the normally chargeable voltage VTH0, the battery 11 is determined to be chargeable in a normal manner. Processing then advances to a step for starting normal charging, for example, the above-described CCCV charging or the pulse charging being described later. Pre-charging is realized as described above.

To realize pre-charging of a battery, it has been necessary to use a transistor for pre-charging having a large on-resistance coupled in parallel with a transistor for charge control. The IC 10 for battery control makes it possible to adjust the on-resistance of the MOS transistor 13 for charging by changing the selection of the voltage VSEL by the voltage selection circuit 1101, so that no transistor for pre-charging is required.

Next, trickle-charging will be described. The trickle charging is for maintaining a fully charged state of a battery by charging the battery with a very small current after the battery is fully charged.

Figure 5:
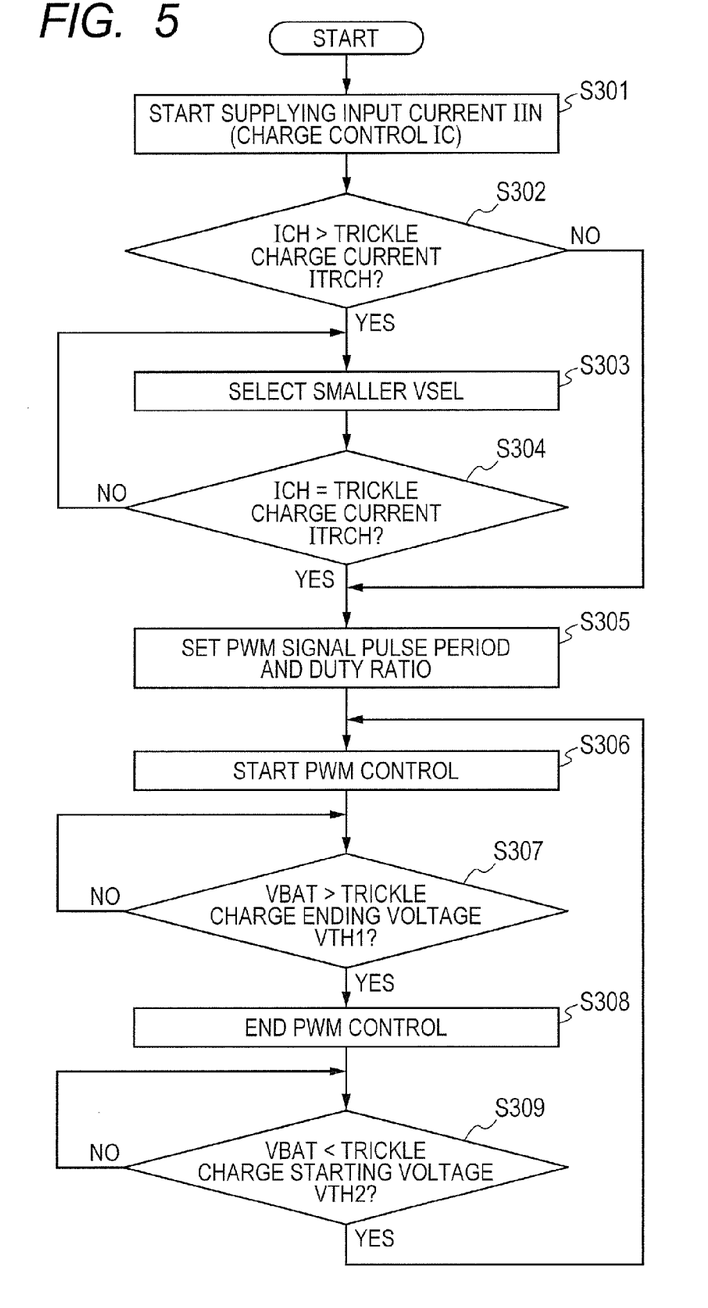
FIG. 5 is a processing flowchart of trickle charging.

FIG. 5 is a processing flowchart of trickle charging. In the following, an example case in which trickle charging is started after completion of CCCV charging will be described. In the present example, it is assumed that the voltage selected when CCCV charging is completed has been set as the initial value of the output voltage VSEL of the voltage selection circuit 1101.

First, when the input current IIN for charging the battery 11 is inputted, the data processing control unit 102 turns on the transistor 13 for charging, thereby causing charging of the battery 11 to be started (S301). To be concrete, the data processing control unit 102 instructs the voltage selection circuit 1101 to start outputting the voltage VSEL selected when the CCCV charging was completed and the logic circuit 1100 to generate the drive signal VGC of a high level (VCC). As a result, a gate drive voltage (DC voltage) equal to the voltage VSEL selected by the voltage selection circuit 1101 is supplied to the gate terminal of the MOS transistor 13 for charging.

The data processing control unit 102 determines whether or not the charge current Ich measured by the current measuring circuit 107 is larger than a trickle charge current ITRCH (S302). The trickle charge current ITRCH represents a target value (a maximum charge current value) of the charge current for trickle charging. Information about the trickle charge current ITRCH is pre-stored, for example, in the storage unit 103 to be read by the data processing control unit 102 when making the above determination. When the charge current Ich is not larger than the trickle charge current ITRCH, processing skips to step S305, being described later, for setting conditions for the PWM signal to be generated. Since trickle charging is made with a very small current, the charge current Ich rarely becomes smaller than the trickle charge current ITRCH.

When the charge current Ich is larger than the trickle charge current ITRCH, the data processing control unit 102 switches the selection signal SEL so as to reduce the output voltage VSEL of the voltage selection circuit 1101 (S303). As a result, the charge current Ich is reduced. Subsequently, the data processing control unit 102 repeats decreasing in stages the output voltage VSEL of the voltage selection circuit 1101 until the charge current Ich measured by the current measuring circuit 107 becomes equal to or smaller than the trickle charge current ITRCH (S303, S304). When the measured charge current Ich becomes equal to or smaller than the trickle charge current ITRCH, the data processing control unit 102 sets conditions for the PWM signal to be generated in the PWM signal generation unit 116 and instructs the PWM signal generation unit 116 to output the PWM signal SPWM (S305). To be concrete, information about the conditions (e.g. pulse period and duty ratio) to be set when trickle-charging a battery and to be met by the PWM signal to be generated is pre-stored, for example, in the storage unit 103. The data processing control unit 102 reads the information pre-stored in the storage unit 103 and sets the information in the PMW signal generation unit 116. As a result, the charge current starts being PWM-controlled (S306). To be concrete, the logic circuit 1100 included in the drive unit 110 generates the drive signal VGC in accordance with the pulse period and duty ratio of the PWM signal SPWM and, thereby, periodically turns on/off the MOS transistor 13 for charging, causing the charge current to be intermittently controlled.

Subsequently, the data processing control unit 102 continues PWM-controlling the charge current until the voltage VBAT of the battery 11 measured by the voltage measuring circuit 105 reaches or exceeds the trickle-charge ending voltage VTH1 (S307). The trickle-charge ending voltage VTH1 represents a charge voltage value used as a reference for stopping the trickle charging. Information about the trickle-charge ending voltage VTH1 is pre-stored, for example, in the storage unit 103 to be read by the data processing control 102 when making the above determination.

When the voltage VBAT reaches or exceeds the trickle-charge ending voltage VTH1, the data processing control unit 102 causes PWM control of the charge current to be stopped (S308). To be concrete, the data processing control unit 102 instructs the PWM signal generation unit 116 to stop outputting the PWM signal SPWM and the logic circuit 1100 to output the drive signal VGC of a low level (GND2). Subsequently, monitoring the voltage VBAT of the battery 11 measured by the voltage measuring circuit 107, the data processing control unit 102 determines whether or not the voltage VBAT is equal to or lower than a trickle-charge starting voltage VTH2 (S309). The trickle-charge starting voltage VTH2 represents a charge voltage value used as a reference for restarting trickle charging. Information about the trickle-charge starting voltage VTH2 is pre-stored, for example, in the storage 103 to be read by the data processing control unit 102 when making the above determination.

When the voltage VBAT is larger than the trickle-charge starting voltage VTH2, the data processing control unit 102 continues monitoring the voltage VBAT of the battery 11 in a state with charging stopped (S309). When the voltage VBAT is equal to or lower than the trickle-charge starting voltage VTH2, processing returns to step S306 causing the data processing control unit 102 to restart PWM-controlling the charge current. Subsequently, steps S306 to S309 are performed repeatedly so as to keep the battery 11 in a fully charged state.

Next, pulse charging will be described. In pulse charging, the charge current is set to be larger than the charge current for CCCV charging, and the charge current is intermittently controlled (pulse-controlled) so as to complete charging in a shorter time than required for normal CCCV charging.

Figure 6:
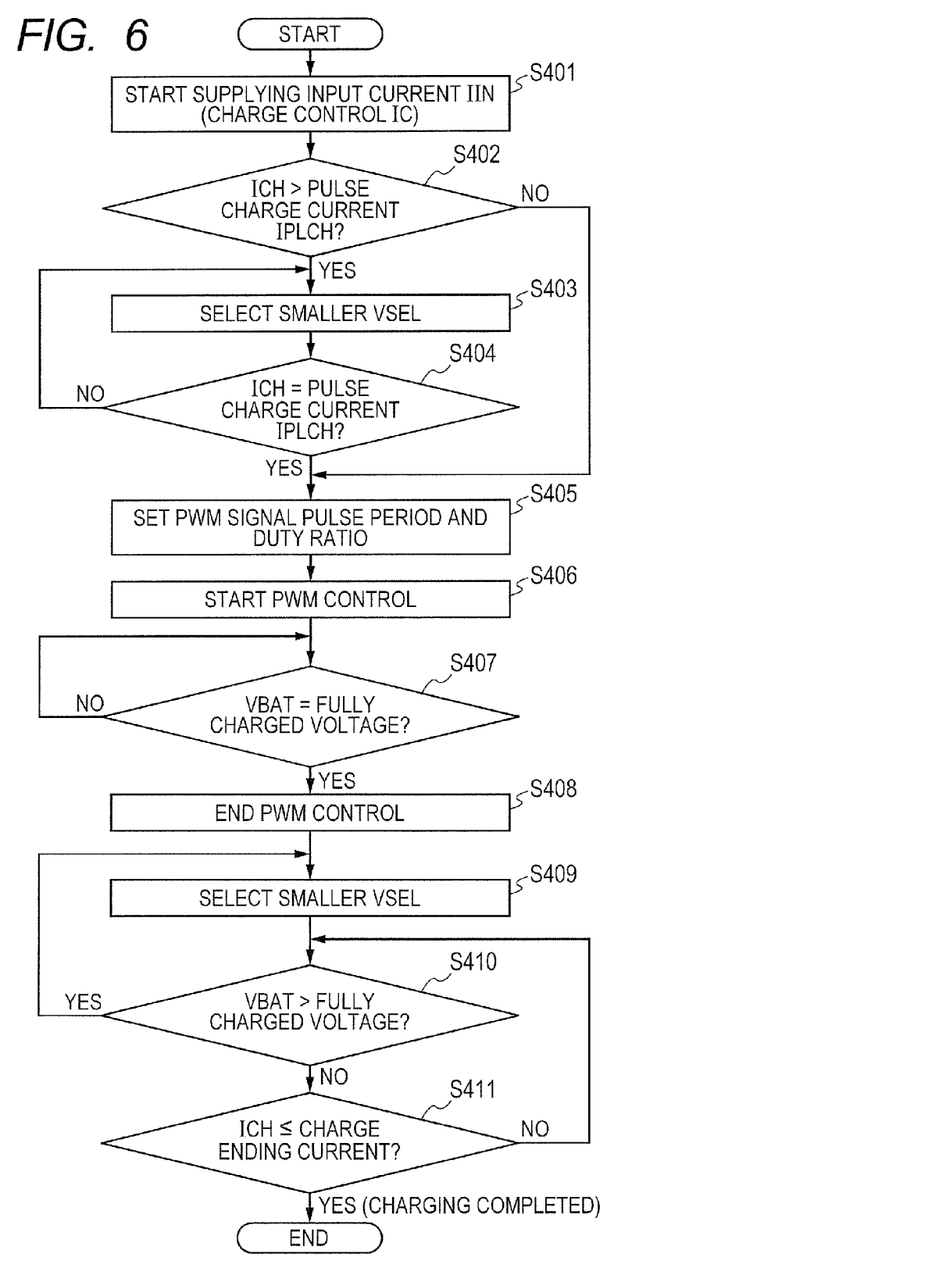
FIG. 6 is a processing flowchart of pulse charging.

FIG. 6 is a processing flowchart of pulse charging. In the present example, the initial value of the output voltage VSEL of the voltage selection circuit 1101 is assumed to be other than a minimum voltage (e.g. $VREF_{\_0}$).

First, when the input current IIN is inputted from the charger 2, the data processing control unit 102 turns on the transistor 13 for charging, thereby causing charging of the battery 11 to be started (S401). To be concrete, the data processing control unit 102 instructs the voltage selection circuit 1101 to start outputting the initial voltage VSEL and the logic circuit 1100 to output the drive signal VGC of a high level (VCC). As a result, a drive voltage (DC voltage) equal to the voltage VSEL selected by the voltage selection circuit 1101 is supplied to the gate terminal of the MOS transistor 13 for charging.

The data processing control unit 102 determines whether or not the charge current Ich measured by the current measuring circuit 107 is larger than the pulse-charge current IPLCH (S402). The pulse-charge current IPLCH represents a target charge current value (a maximum charge current) for pulse charging. Information about the pulse-charge current IPLC is pre-stored, for example, in the storage unit 103 to be read by the data processing control unit 102 when making the above determination.

When the charge current Ich is not larger than the pulse-charge current IPLCH, processing skips to step S405, being described later, for setting conditions for the PWM signal to be generated. When the charge current Ich is larger than the trickle charge current ITRCH, the data processing control unit 102 switches the selection SEL to reduce the output voltage VSEL of the voltage selection circuit 1101 (S403). As a result, the charge current Ich is reduced. Subsequently, the data processing control unit 102 repeats decreasing in stages the output voltage VSEL of the voltage selection circuit 1101 until the charge current Ich measured by the current measuring circuit 107 becomes equal to or smaller than the pulse-charge current IPLCH (S403, S404). When the charge current Ich becomes equal to or smaller than the pulse-charge current IPLCH, the data processing control unit 102 sets conditions for the PWM signal to be generated in the PWM signal generation unit 116 and instructs the PWM signal generation unit 116 to output the PWM signal SPWM (S405). To be concrete, information about the conditions (e.g. pulse period and duty ratio) for the PWM signal to be generated is pre-stored in the storage unit 103. The data processing control unit 102 reads the information pre-stored in the storage unit 103 and sets the information in the PMW signal generation unit 116. As a result, the charge current starts being PWM-controlled (S406). To be concrete, the logic circuit 1100 included in the drive unit 110 generates the drive signal VGC in accordance with the pulse period and duty ratio of the PWM signal SPWM and, thereby, periodically turns on/off the MOS transistor 13 for charging, causing the charge current to be intermittently controlled.

Subsequently, the data processing control unit 102 continues PWM-controlling the charge current until the voltage VBAT of the battery 11 measured by the voltage measuring circuit 105 reaches a fully charged voltage (S407). When the voltage VBAT reaches or exceeds the fully charged voltage, the data processing control unit 102 stops PWM-controlling the charge current (S408). To be concrete, the data processing control unit 103 instructs the PWM signal generation unit 116 to stop outputting the PWM signal SPWM and the logic circuit 1100 to output the drive signal VGC of a low level (GND2). The data processing control unit 102 then starts control for switching from charging by PWM control (pulse charging) to constant-voltage charging. To be concrete, the data processing control unit 102 reduces the charge current Ich by switching the selection signal SEL so as to reduce the output voltage VSEL of the voltage selection circuit 1101 (S409). The data processing control unit 102 determines whether or not the voltage VBAT of the battery 11 is higher than the fully charged voltage (S410). When the voltage VBAT is higher than the fully charged voltage, the data processing unit 104 repeats reducing, in stages, the output voltage VSEL of the voltage selection circuit 1101 until the voltage VBAT becomes equal to or lower than the fully charged voltage (S409 and S410).

When the voltage VBAT becomes equal to or lower than the fully charged voltage, the data processing control unit 102 determines whether or not the value of the charge current Ich measured by the current measuring circuit 107 is larger than the charge ending current (S411). When the charge current Ich is larger than the charge ending current, processing returns to step S410 to continue constant-voltage charging. When the value of the charge current Ich becomes equal to or smaller than the charge ending current, the data processing control unit 102 determines that charging has been completed and turns off the MOS transistor 13 for charging, thereby stopping the charging.

As described above, according to the IC 10 for battery control of the present embodiment, in addition to battery level control for the battery 11, charging of the battery 11 can also be controlled. Also, the IC 10 for battery control can adjust the charge current by changing the magnitude of the gate drive voltage supplied to the MOS transistor 13 for charging based on the result of measurement of the charge current of the battery 11, so that high-accuracy charge control is enabled. The IC 10 for battery control adjusts the charge current not by linearly controlling the gate drive voltage of the MOS transistor for charging while monitoring the charge current. The IC 10 for battery control optimizes the charge current by changing, in stages, the gate drive voltage for the MOS transistor for charging in accordance with program processing by the CPU. Namely, according to the IC 10 for battery control, charging of a battery can be controlled by monitoring the condition of the battery and program processing, so that, compared with cases in which a known FG-IC circuit configuration including an analog circuit for charge control is used, an increase in the chip area can be inhibited. Since charging is controlled by program processing, various types of charging such as trickle charging, pre-charging, and pulse charging can be controlled in addition to the CCCV charging. Therefore, compared with cases in which charging is controlled using an analog circuit, flexible charge control can be easily realized. Also, with the IC 10 for battery control included in the battery pack 1, the condition of the battery can be monitored and charging of the battery can be controlled both on the battery pack side. Therefore, when an IC for charge control with a simple configuration capable of constant-current output like the above charger 2 is available, charge control is enabled without requiring any high-accuracy charge control device on the charger side. Namely, it is not necessary to provide on the charger side any high-function IC for charge control or sense resistor or any transistor for charge control. This makes it possible to reduce the number of parts required and reduce the overall system cost.

Even though the invention made by the present inventors has been concretely described based on an embodiment, the invention is not limited to the embodiment and can be modified in various ways within the scope of the invention.

For example, the voltage generation circuit included in the drive unit 110 is not limited to the resistor ladder circuits 1104 and 1105 and may be configured differently as long as plural voltages can be generated. Even though, in the configuration of the above embodiment, the pre-driver circuit 1103 provided between the logic circuit 1100 and the level shift circuit 1102, a different circuit configuration may be used as long as the control signal outputted from the logic circuit 1100 can be supplied, after being shifted to the level of the voltage VSEL, to the gate terminal of the MOS transistor 13 for charging. Also, the IC 10 for battery control formed on a single chip in the above embodiment is not limited to the single-chip configuration. Namely, it may have a multi-chip configuration.

What is claimed is:

1. A semiconductor device for monitoring a condition of a secondary battery and controlling charging of the secondary battery, comprising:
    a voltage measuring unit for measuring a voltage of the secondary battery;
    a current measuring unit for measuring a current of the secondary battery;
    drive unit for driving a transistor for controlling a charge current of the secondary battery; and
    a data processing control unit for executing program processing;
    wherein the data processing control unit, based on measurement values obtained by the voltage measuring unit and the current measuring unit, generates condition information including information about a battery level of the secondary battery and controls the drive unit,
    wherein the drive unit is configured to be capable of selecting one of a plurality of different voltages as a drive voltage for turning on the transistor, and
    wherein the data processing control unit adjusts the charge current of the secondary battery by switching selection of the drive voltage.

2. The semiconductor device according to claim 1, wherein the drive unit includes:
    a voltage generation circuit for generating a plurality of voltages;
    a voltage selection circuit for selecting one of the voltages generated by the voltage generation circuit based on an instruction from the data processing control unit;
    a drive signal generation unit for generating, based on an instruction from the data processing control unit, a drive signal for driving the transistor, and a level shift circuit for level-shifting the drive signal generated by the drive signal generation unit to the voltage selected by the voltage selection circuit.

3. The semiconductor device according to claim 2, further comprising a regulator circuit for generating a reference voltage based on the voltage of the secondary battery,
wherein the voltage generation circuit includes a first resistor ladder circuit for dividing the reference voltage generated by the regulator circuit into a plurality of voltages.

4. The semiconductor device according to claim 3,
wherein the voltage generation circuit includes a second resistor ladder circuit for inputting thereto the voltage of the secondary battery and dividing the voltage into a plurality of voltages.

5. The semiconductor device according to claim 2, further comprising a PWM signal generation unit for generating a PWM signal in accordance with a condition for a PWM signal to be generated set by the data processing control unit,
wherein the drive signal generation unit generates the drive signal with a pulse period and a duty ratio of the PWM signal generated by the PWM signal generation unit.

6. The semiconductor device according to claim 2,
wherein, when charging the secondary battery, the data processing control unit performs processing for:
comparing a charge rate calculated based on a current value measured by the current measuring unit and a target charge rate;
selecting, when the calculated charge rate is larger than the target charge rate, the drive voltage such that the calculated charge rate becomes equal to the target charge rate;
selecting, when, after starting charging of the secondary battery, the voltage of the secondary battery rises to a fully charged voltage, the drive voltage such that the voltage of the secondary battery does not exceed the fully charged voltage, and
instructing, when the current value measured by the current measuring unit becomes smaller than a charge ending current, the drive signal generation unit to generate the drive signal for turning off the transistor.

7. The semiconductor device according to claim 5,
wherein, when charging the secondary battery, the data processing control unit performs processing for:
selecting the drive voltage such that the current value measured by the current measuring unit becomes equal to a target current value for trickle charging;
setting the condition for the PWM signal to be generated in the PWM signal generation unit, and
causing the PWM signal generation unit to stop outputting the PWM signal when, after starting charging of the secondary battery, the voltage of the secondary battery rises to a first threshold voltage and to restart outputting the PWM signal, when the voltage of the secondary battery lowers to a secondary threshold voltage lower than the first threshold voltage.

8. The semiconductor device according to claim 5,
wherein, when charging the secondary battery, the data processing control unit performs processing for:
selecting, when the voltage of the secondary battery is lower than a third threshold voltage, the drive voltage such that the current value measured by the current measuring unit becomes equal to a target current value for pre-charging;
setting the condition for the PWM signal to be generated in the PWM signal generation unit;
causing, when, after starting charging of the secondary battery, the voltage of the secondary battery rises, generation of the drive signal to be continued until the voltage of the secondary voltage reaches the third threshold voltage, and
causing, when, after starting charging of the secondary battery, the voltage of the secondary battery does not rise, generation of the drive signal to be stopped.

9. The semiconductor device according to claim 5,
wherein, when charging the secondary battery, the data processing control unit performs processing for:
selecting the drive voltage such that the current value measured by the current measuring unit becomes equal to a target current value for pulse charging;
setting the condition for the PWM signal to be generated in the PWM signal generation unit and instructing the PWM signal generation unit to output the PWM signal;
causing, when, after starting charging of the secondary battery, the voltage of the secondary battery rises to a fully charged voltage, the PWM signal generation unit to stop outputting the PWM signal and instructing the drive signal generation unit to generate a drive signal for turning on the transistor;
lowering the drive voltage so as not to allow the voltage of the secondary battery to exceed the fully charged voltage, and
instructing, when the current value measured by the current measuring unit becomes smaller than a charge ending current, the drive signal generation unit to generate a drive signal for turning off the transistor.

10. A battery pack comprising:
a first power terminal and a second power terminal;
a secondary battery coupled between the first power terminal and the second power terminal and including a single cell or a plurality of cells;
a first transistor provided in a current path formed, through the secondary battery, between the first power terminal and the second power terminal to control a charge current of the secondary battery;
a second transistor provided in the current path to control a discharge current of the secondary battery;
a sense resistor provided in the current path; and
the semiconductor device according to claim 1,
wherein the semiconductor device can measure a voltage across the secondary battery using the voltage measuring unit and a current flowing through the sense resistor using the current measuring unit and can drive the first transistor and the second transistor using the drive unit.

* * * * *